United States Patent
Kim et al.

(10) Patent No.: US 8,946,616 B2
(45) Date of Patent: Feb. 3, 2015

(54) ANALOG-TO-DIGITAL CONVERTER USING VARIABLE COUNTING INTERVAL AND IMAGE SENSOR INCLUDING SAME

(75) Inventors: Jin Woo Kim, Seoul (KR); Seog Heon Ham, Suwon-si (KR); Kyung-Min Kim, Suwon-si (KR); Yong Lim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 511 days.

(21) Appl. No.: 13/276,927

(22) Filed: Oct. 19, 2011

(65) Prior Publication Data

US 2012/0097840 A1     Apr. 26, 2012

(30) Foreign Application Priority Data

Oct. 20, 2010 (KR) .................. 10-2010-0102336

(51) Int. Cl.
    *H03F 3/08* (2006.01)
    *H03M 1/00* (2006.01)
    *H04N 5/372* (2011.01)
    *H04N 5/378* (2011.01)
    *H03M 1/12* (2006.01)
    *H03M 1/56* (2006.01)

(52) U.S. Cl.
    CPC ........... *H03M 1/002* (2013.01); *H04N 5/37213* (2013.01); *H04N 5/378* (2013.01); *H03M 1/123* (2013.01); *H03M 1/56* (2013.01)

USPC ............... 250/214 A; 250/214.1; 250/208.1; 257/431; 348/300; 348/301

(58) Field of Classification Search
USPC ..... 250/214.1, 208.1, 214 R, 214 A, 214 DC; 257/431; 348/272, 281, 294, 300, 301, 348/302, 306
See application file for complete search history.

(56) References Cited

U.S. PATENT DOCUMENTS

| | | | | |
|---|---|---|---|---|
| 7,301,487 B2 * | 11/2007 | Funakoshi et al. | ............ | 341/122 |
| 2008/0284886 A1 * | 11/2008 | Wakabayashi et al. | ....... | 348/301 |
| 2009/0159782 A1 | 6/2009 | Murakami et al. | | |

FOREIGN PATENT DOCUMENTS

| | | |
|---|---|---|
| JP | 2009-206709 | 9/2009 |
| KR | 1020080033890 A | 4/2008 |
| KR | 1020090037836 A | 4/2009 |

* cited by examiner

*Primary Examiner* — Francis M Legasse, Jr.
(74) *Attorney, Agent, or Firm* — Volentine & Whitt, PLLC (57) ABSTRACT

An analog-to-digital converter (ADC) within an image sensor includes a comparator comparing a ramp signal with an image signal, and a counter generating a count result in response to the comparison by counting a clock during a counting interval. The ADC determines whether a first counting interval for the counter is less than a reference interval, and if the first counting interval is less than the reference interval the counting interval is a first counting interval, else the counting interval is a second counting interval.

10 Claims, 9 Drawing Sheets

ANALOG-TO-DIGITAL CONVERTER USING VARIABLE COUNTING INTERVAL AND IMAGE SENSOR INCLUDING SAME

CROSS-REFERENCE TO RELATED APPLICATIONS

This application claims priority under 35 U.S.C. §119 to Korean Patent Application No. 10-2010-0102336 filed on Oct. 20, 2010, the subject matter of which is hereby incorporated by reference.

BACKGROUND OF THE INVENTION

The present inventive concept relates to an analog-to-digital converters (ADC) and image sensors including ADC. More particularly, the inventive concept relates to ADC having reduced power consumption and image sensors including same.

Image sensors are devices that capture images as detected optical signals, and generate corresponding digital data using certain properties inherent in semiconductor materials. Recent developments enhancing the performance and reducing the cost of complementary metal-oxide-semiconductor (CMOS) technology have resulted in a widespread use of CMOS image sensors.

Many CMOS image sensors use correlated double sampling (CDS) to process digital data. That is, many CMOS image sensors essentially "count" a signal as it is sampled using CDS (e.g., a difference between a reset signal and an image signal is detected on a time-wise basis). The resulting count value is used to generate a digital signal. However, power is consumed during the counting function, and the extent of the counting function is proportional to a luminance component of the detected optical signal. Hence, higher luminance results in extended counting, which in turn results in relatively more power consumption. Accordingly, it is desirable to reduce, limit or minimize the extent of counting when relatively high luminance is apparent.

SUMMARY OF THE INVENTION

Certain embodiments of the inventive concept provide analog-to-digital converters (ADC) that provide reduced counting in response to high luminance, and image sensors including same.

In one embodiment, the inventive concept provides an analog-to-digital converter (ADC) configured for use within an image sensor including an array of pixels arranged in a plurality of columns, the ADC comprising; a comparator configured to compare a decreasing ramp signal with an image signal provided by a column of pixels and output a comparison result signal, and a counter configured to receive the comparison signal and generate a count result by counting a clock during a counting interval. The ADC determines whether a first counting interval for the counter is less than a reference interval, and if the first counting interval is less than the reference interval the counting interval is a first counting interval, else the counting interval is a second counting interval.

In another embodiment, the inventive concept provides an image sensor comprising; a pixel array comprising a plurality of pixels arranged in columns, wherein each column of pixels is configured to provide an image signal, a correlated double sampling (CDS) block configured to perform correlated double sampling on the image signal and provide a corresponding CDS output signal, a ramp generator configured to generate a decreasing ramp signal, and an analog-to-digital converter (ADC) configured to receive the CDS output signal and the ramp signal. The ADC comprises a comparator configured to compare the ramp signal with the image signal and output a comparison result signal, and a counter configured to receive the comparison signal and generate a count result by counting a clock during a counting interval, wherein the ADC determines whether a first counting interval for the counter is less than a reference interval, and if the first counting interval is less than the reference interval the counting interval is a first counting interval, else the counting interval is a second counting interval.

In another embodiment, the inventive concept provides a method of operating an analog-to digital converter (ADC) within an image sensor. The method comprises generating an image signal from a column of pixels in an array of pixels in response to incident light received by the array of pixels, wherein the image signal consist of a reset signal component and an image signal component, providing the image signal to a correlated double sampling (CDS) block configured to perform correlated double sampling on the image signal and provide a corresponding CDS output signal, and in the ADC, comparing a decreasing ramp signal with the CDS output signal to generate a comparison result, and providing a count result indicating a difference between the ramp signal and CDS output signal by counting a clock during a counting interval, wherein the counting interval varies according to a determination made by the ADC that a first counting interval is less than a reference interval.

BRIEF DESCRIPTION OF THE DRAWINGS

The above and other features and advantages of the inventive concept will become more apparent upon consideration of certain embodiments set forth hereafter with reference to the attached drawings in which.

DETAILED DESCRIPTION

Certain embodiments of the inventive concept will now be described with reference to the accompanying drawings. The inventive concept may, however, be embodied in many different forms and should not be construed as being limited to only the illustrated embodiments. Rather, these embodiments are provided so that this disclosure will be thorough and complete, and will fully convey the scope of the invention to those skilled in the art.

Throughout the written description and drawings, like reference numbers, labels and signal designations are used to denote like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
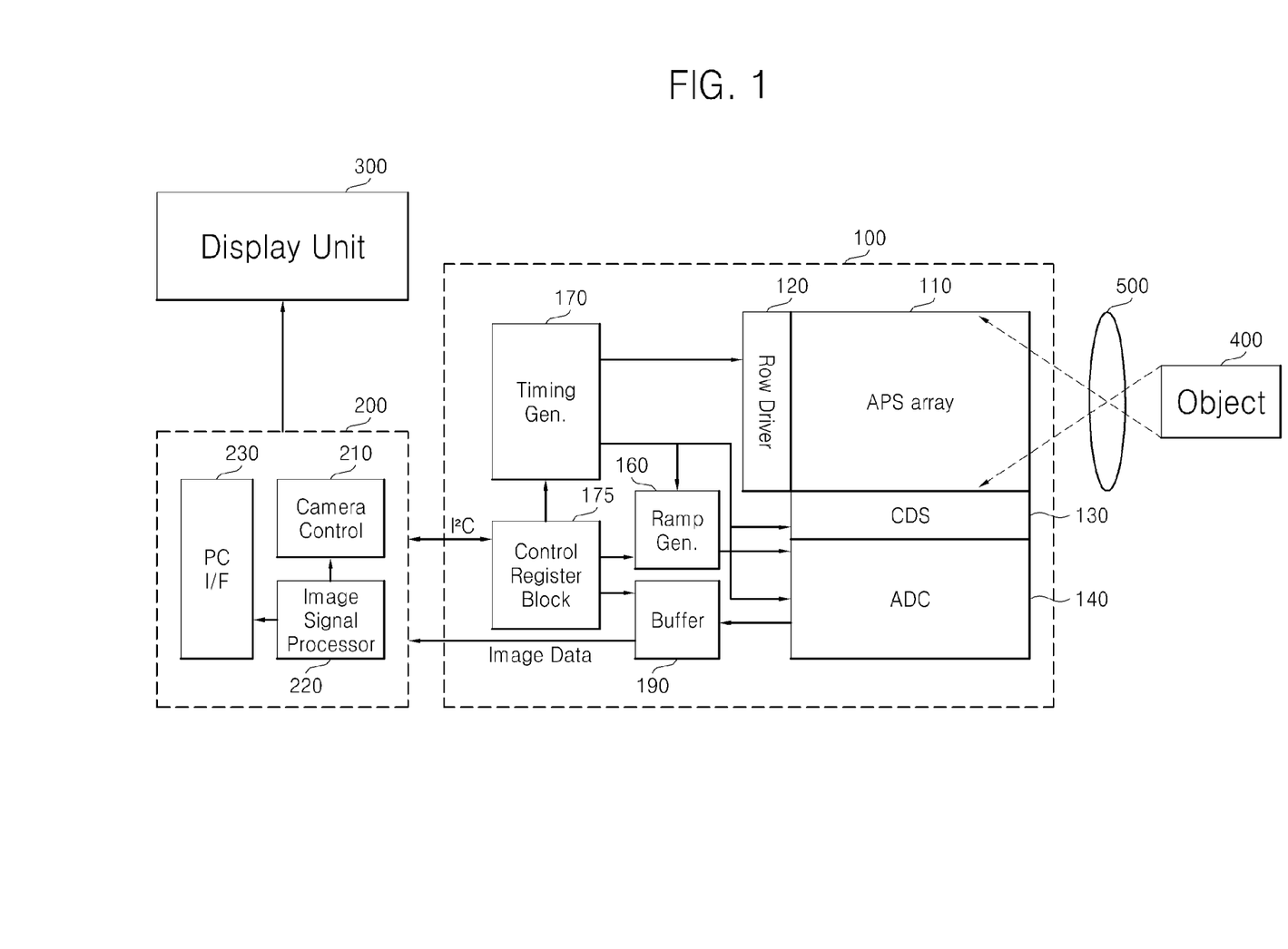
FIG. 1 is a schematic diagram illustrating relevant portions of an image sensor according to an embodiment of the inventive concept.

Figure (FIG. 1 is a schematic diagram illustrating in relevant portion an image sensor 100 according to an embodiment of the present inventive concept. Referring to FIG. 1, the image sensor 100 comprises a pixel array or an active pixel sensor (APS) array 110, a row driver 120, a correlated double sampling (CDS) block 130, an analog-to-digital converter (ADC) 140, a ramp generator 160, a timing generator 170, a control register block 175, and a buffer 190.

The image sensor 100 is controlled in its operation by an image processor or digital signal processor (DSP) 200 and may be used to optically sense an object 400 through a lens 500. The DSP 200 is thus able to provide output data corresponding to the optically sensed object 400. Such output data may then be communicated to a display unit 300 that is capable of visually representing a display image in the likeness of the object 400. Any one of many different types of conventionally understood display units may be used.

Further, the image sensor 100, DSP 200, and display unit 300 may be functionally combined within a number of different types of host devices, such as computers, mobile phones, handheld personal information devices, etc.

In the example illustrated in FIG. 1, the DSP 200 comprises a camera control 210, an image signal processor 220, and a personal computer (PC) interface (I/F) 230. The camera control 210 may be configured to control the control register block 175 of the image sensor 100. In certain embodiments of the inventive concept, the camera control 210 may control the control register block 175 using an inter-integrated circuit ($I^2C$). But the scope of the present invention is not restricted thereto.

The image signal processor 220 may be further configured to receive image data provided (e.g.) from the buffer 190 of the image sensor 100 and performs certain data processing functions on the image data to improve the quality or define the properties of the image ultimately displayed by the display unit 300 and image data communicated to an external device via (e.g.) the PC I/F 230.

It should be noted at this point that the configuration of major elements within the embodiment of FIG. 1 is arbitrary and is presented as one possible implementation example. Those skilled in the art will understand, for example, that the image signal processor 220 might disposed internal to the image sensor 100 instead of being disposed in the DSP 200.

Looking more particularly at the image sensor 100 of FIG. 1, the pixel array 110 includes a plurality of photo sensitive devices such as photo diodes or pinned photo diodes. The pixel array 110 senses some defined portion of the electromagnetic spectrum (hereafter, generically referred to as "light" recognizing that this term may include visible and not visible (e.g., infrared) components of the electromagnetic spectrum). The photo sensitive devices detect and convert the light into corresponding analog signal(s) (hereafter, collectively and singularly referred to as "an image signal").

The timing generator 170 may be used to provide one or more timing control signal(s) (hereafter, collectively and singularly referred to as the "timing control signal") to the row driver 120, ADC 140, and ramp generator 160 to control their respective and interrelated operation(s). The control register block 175 may be used to provide one or more control signal(s) (hereafter, collectively and singularly referred to as the "control signal") to the ramp generator 160, timing generator 170, and buffer 190 to control their respective and interrelated operation(s).

In response to the timing control signal, the row driver 120 drives the pixel array 110 in row-wise units. For instance, the row driver 120 may generate a row selection signal. In response to the row selection signal, the pixel array 110 provides the image signal to the CDS block 130 along with a corresponding reset signal. The reset signal may be variously provided, and it is assumed in the embodiment of FIG. 1 the CDS block 130 performs a CDS function using the reset signal and image signal.

The ADC 140 compares a ramp signal provided by the ramp generator 160 with a "CDS output signal" provided by the CDS block 130 as a result of the comparison between the image signal and the reset signal. An "ADC output signal" which is the result of the comparison between the ramp signal and the CDS output signal is counted by the ADC 140 and a corresponding digital "count result" is stored in the buffer 190.

The buffer 190 temporarily stores count result provided by the ADC 140, and may perform certain sense and amplification functions on the count result to generate corresponding image data to be output to the DSP 200 and/or display unit 300. Thus, in certain embodiments, the buffer 190 may include a plurality of column memory blocks (e.g., static random access memories (SRAMs)) provided to store respective groupings (e.g., columns) of count result data, and a sense amplifier provided to sense and amplify the digital count result data provided by the ADC 140.

Figure 2:
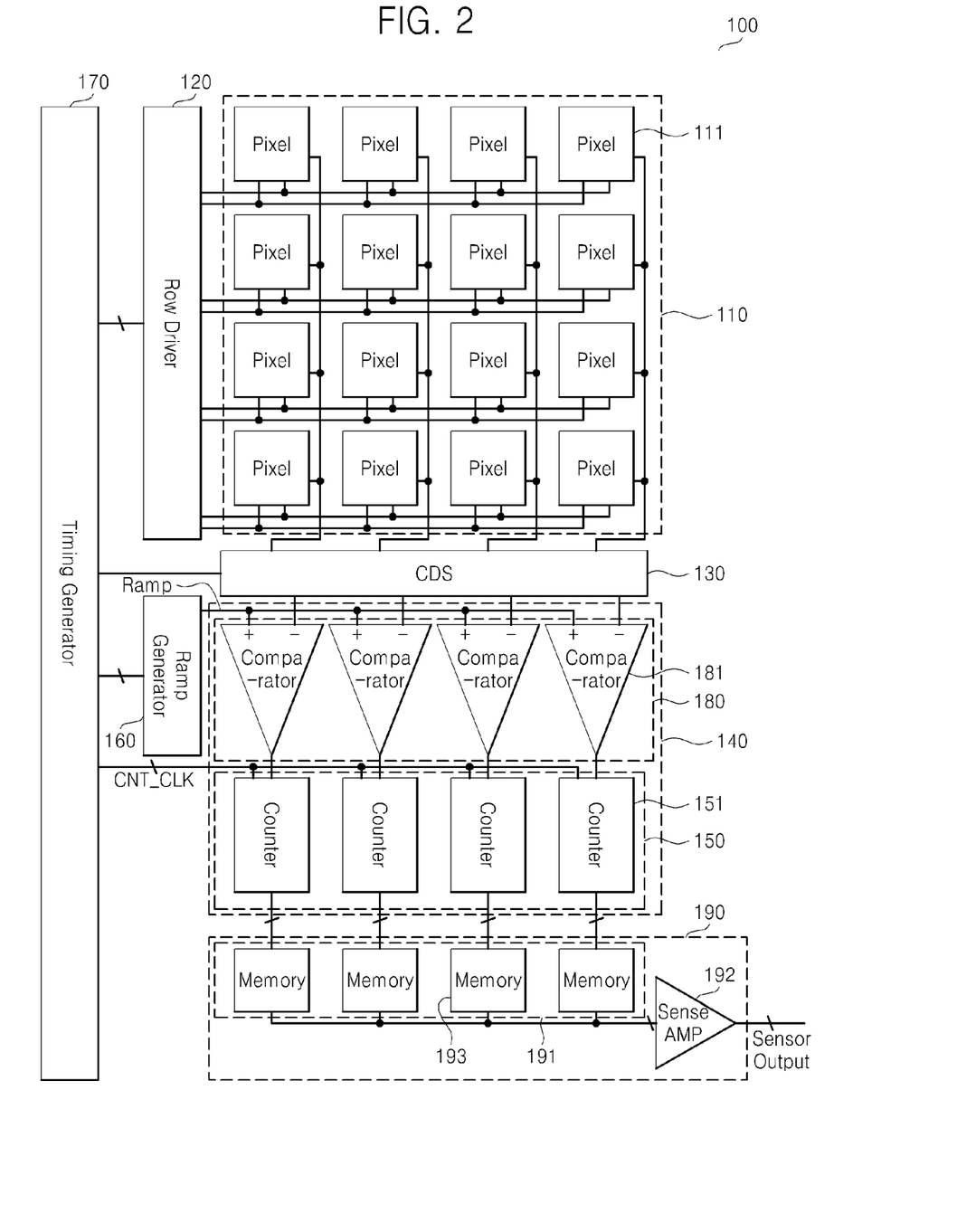
FIG. 2 further illustrates the image sensor of FIG. 1.

FIG. 2 further illustrates the image sensor 100 of FIG. 1. Referring to FIG. 2, the image sensor 100 includes, as before, the pixel array 110, row driver 120, CDS block 130, ADC 140, ramp generator 160, timing generator 170, the buffer 190. As shown, the ADC 140 comprises a comparison block 180 and a counter block 150.

The pixel array 110 is shown as further comprising a plurality of pixels 111 arranged in a matrix. Various sub-sets of the pixels 111 are connected in respective rows and columns among a plurality of row and a plurality of column. The pixels 111 may include red pixels that convert light in the defined red spectrum into a corresponding electrical signal, green pixels that convert light in a defined green spectrum into a corresponding electrical signal, and a blue pixel that converts light in a defined blue spectrum into a corresponding electrical signal. In certain embodiments, one or more color filter(s) may be included in relation to individual pixels 111 in order to filter incident light according to a particular spectrum.

The row driver 120 may be configured to receive and decode a row control signal (e.g., an address signal) provided by (or through) the timing generator 170, and select at least one row line among the row lines in the pixel array 110 in response to a decoded row control signal.

The CDS block 130 may be configured to perform CDS on respective image signals provided by individual pixels or collections of pixels 111 connected (e.g.) to one of the column lines in the pixel array 110.

As illustrated in FIG. 2, the comparison block 180 comprises a plurality of comparators 181 respectively connected to the CDS block 130 and the ramp generator 160. In one embodiment, the CDS block 130 may be connected to respective first input terminals for the comparators 181, and the ramp generator 160 may be connected to respective second input terminals of comparators 181.

With this configuration, the comparators 181 are able to compare the CDS output signal provided by the CDS block 130 with a ramp signal (Ramp) provided by the ramp generator 160, and provide a corresponding comparison result signal (i.e., the output value COMP_OUT of the comparator) via respective output terminals of the comparators 181. Thus, the CDS output signal provided by the CDS block 130 corresponds to a difference between the image signal component that varies with the luminance component of the incident light (i.e., the portion of the electromagnetic spectrum received by the pixels 111) and the reset signal component. To output the difference between the image signal component and the reset signal component, the ramp signal is used, so that the difference between the image signal component and the reset signal component is detected and output as a function of the slope of the ramp signal.

The counter block 150 comprises a plurality of counters 151. The counters 151 are respectively connected to output terminals of the comparators 181. Each counter 151 counts an applied COMP_OUT signal (i.e., an applied comparison result signal) based on a clock signal CNT_CLK provided by the timing generator 170 as a timing control signal, or generated within the counter block 150 in response to the timing control signal provided by the timing generator 170. In this manner, each counter 151 within the counter block 150 may provide a digital count result.

Each counter 151 may be an up/down counter or a bit-wise inversion counter. The bit-wise inversion counter may perform a similar operation to that of the up/down counter. For instance, the bit-wise inversion counter performs up-counting and bit inversion to effectively implement a 1's complement approach to counting. In this manner, the bit-wise inversion counter may perform reset counting and invert a result of the reset counting, such that the result is converted into a 1's complement form, (i.e., a negative value).

In the embodiment of FIG. 2, the buffer 190 comprises a column memory block 191 and a sense amplifier 192. The column memory block 191 includes a plurality of individual memories 193. The plurality of memories 193 respectively operate in response to a memory control signal provided by a memory controller (not shown), may be disposed within the column memory block 191 (or within the timing generator 170) and may operate in response to the timing control signal provided by the timing generator 170. In certain embodiments, each individual memory 193 may be an SRAM.

In response to the memory control signal, the column memory block 191 may be used to temporarily store the digital count result provided from the counter 151 and then outputs an amplified version of same via the sense amplifier 192.

Figure 3:
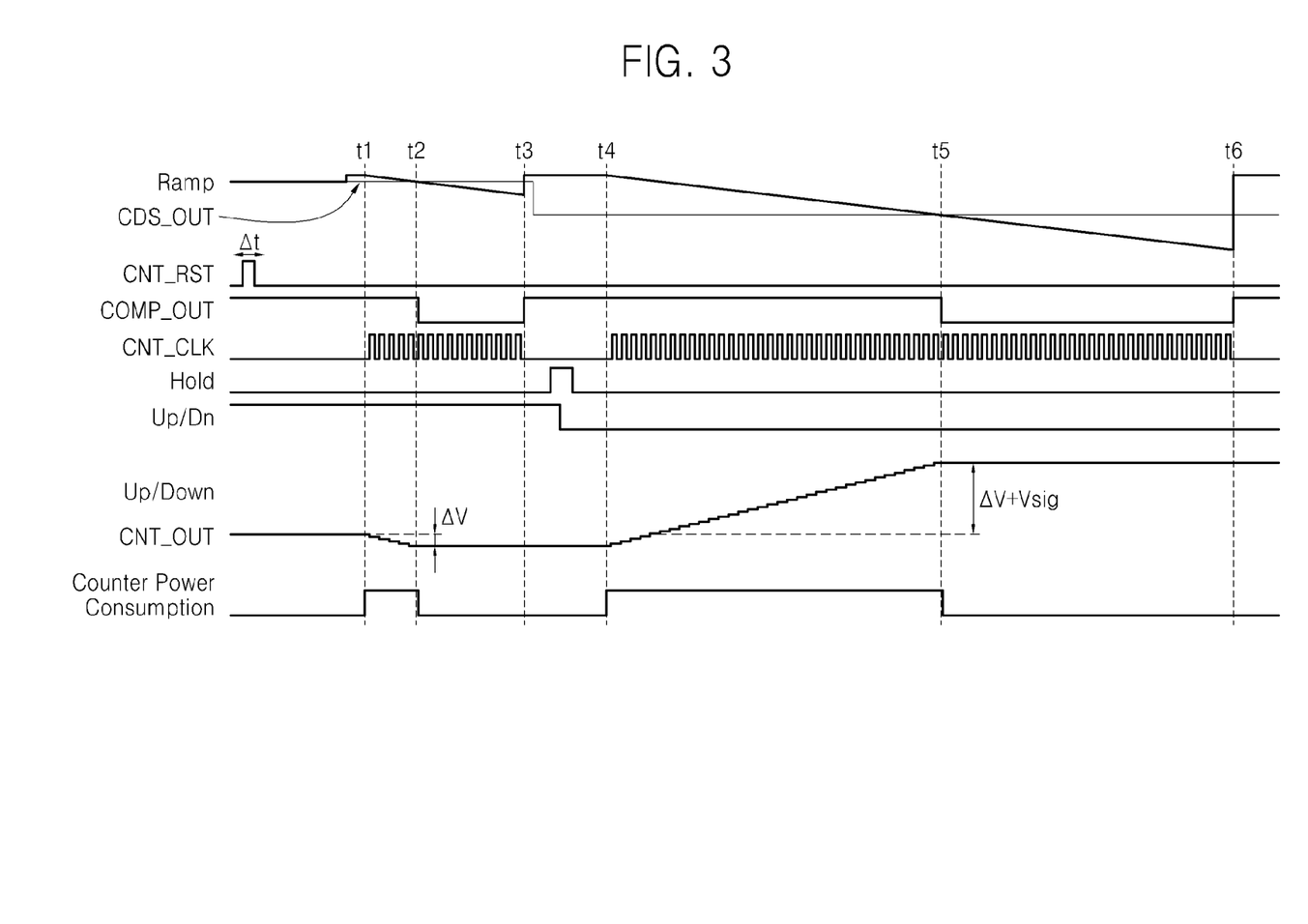
FIG. 3 is a signal waveform diagram illustrating certain signals that further illustrate the operations of an analog-to-digital converter (ADC) according to embodiments of the inventive concept.

FIG. 3 is a waveform diagram showing certain signals that further illustrate possible operation of the ADC 140 within the image sensor 100 of FIGS. 1 and 2.

When converting the image signal provided by the pixels 111 into a corresponding count result (image data), the ADC 140 finds a point at which a value of the decreasing ramp signal (Ramp) having a predetermined slope equals a value of the image signal by comparing the ramp signal to the image signal. As shown in FIG. 3, the ADC 140 counts from time t1 where the ramp signal is generated (e.g., a point where the ramp signal Ramp starts decreasing) to time t2 where the ramp signal has a value equal to the image signal in order to obtain a count value corresponding to the magnitude of the image signal. In the working examples, the image signal (or pixel signal) is output from a column line of the pixel array 110 and may be understood as including a reset component AV and an image signal component Vsig.

A reset control signal (CNT_RST) received from the timing generator 170 is maintained active (e.g., at a high level) for a predetermined period of time At to reset the count value of the counter block 150. The ramp signal generated by the ramp generator 160 is applied to each of the comparators 181, and each comparator 181 compares the current level of the ramp signal Ramp to a level of the CDS output signal (CDS_OUT) provided by the CDS block 130 which is received from a column line corresponding to the comparator 181.

For a first reading, the comparator 181 inverts an output value (COMP_OUT) from high to low until the ramp signal becomes greater than the CDS output signal at time t3 after the ramp signal has previously fallen to be equal to the CDS output signal at time t2. The counter block 150 stops counting at time t2 when the output value (COMP_OUT) of the comparator 181 is inverted and latches a count value as data. As a result, the counter block 150 consumes power during a period between the time t1 and time t2.

The count clock signal (CNT_CLK) applied to the counter block 150 and is toggled beginning at time t1 when the ramp signal begins decreasing and ending at time t3. In other words, at time t3, the input of the count clock signal (CNT_CLK) to the counter block 150 is halted.

As a result, down-counting of an output value CNT_OUT by the counter block 150 starts when the ramp signal is generated (e.g., when the ramp signal Ramp starts decreasing) at time t1 and a clock signal is counted until time t2 when an inverted output signal is obtained after comparison is performed by the comparison block 180, so that a count value corresponding to the voltage AV of a reset signal is obtained.

For a second reading, the image signal component Vsig generated by each pixel 111 in accordance with a quantity of incident light is read. The second reading is performed in a similar manner to the first reading. However, for the second reading, a hold signal for holding the count value corresponding to the voltage ΔV of the reset signal and an up/down control signal Up/Dn for indicating the second reading may be inverted by the timing generator 170 and then applied to the counter block 150.

The comparator 181 inverts the output value (COMP_OUT) from high to low starting at time t5 when the ramp signal, which again decreases beginning at time t4, falls to be equal to the CDS output signal till time t6 when the ramp signal is greater than the CDS output signal. At this time, the counter block 150 stops counting at time t5 when the output value (COMP_OUT) of the comparator 181 is inverted and latches a count value at time t5 as data. As a result, the counter block 150 consumes power during a period between time t4 and time t5.

The count clock signal (CNT_CLK0) is applied to the counter block 150 and is toggled beginning from time t4 when the ramp signal starts decreasing to a final decreasing point, i.e., time t6. In other words, after time t6, the input of the count clock signal (CNT_CLK) to the counter block 150 is again halted. The time t6 may mark the termination of generating the ramp signal (i.e., a last decreasing point for the ram signal).

As a result, up-counting of an output value (CNT_OUT) of the counter block 150 starts when the ramp signal is generated (e.g., when the ramp signal Ramp starts decreasing) at time t4 and a clock signal is counted until time t5 when an inverted output signal is obtained after comparison is performed by the comparison block 180, such that a count value corresponding to the sum (ΔV+Vsig), wherein AV of the reset signal and Vsig is the image signal component, is obtained.

The counter block 150 performs down-counting during the first reading and up-counting during the second reading. When a calculation of [(second count value)+(first count value)] is performed by the counter block 150, said calculation is actually subtraction since down-counting is performed during the first reading. The resulting value of the "subtraction" may be kept in the counter block 150 as an n-bit digital value. Consequently, the count result corresponds to a digital value that is defined by the relationship (ΔV+Vsig)+(−ΔV) =Vsig.

As illustrated in FIG. 3, power consumption for the counter block 150 occurs during a first power consumption interval between times t1 and t2 and a second power consumption interval between times t4 and t5. Thus, FIG. 3 shows how down-counting may be performed in relation to a reset signal while up-counting is performed for an image signal. Of course, the reverse may be true and yet result in a count result properly accounting for the bias of the reset signal ΔV.

Figure 4:
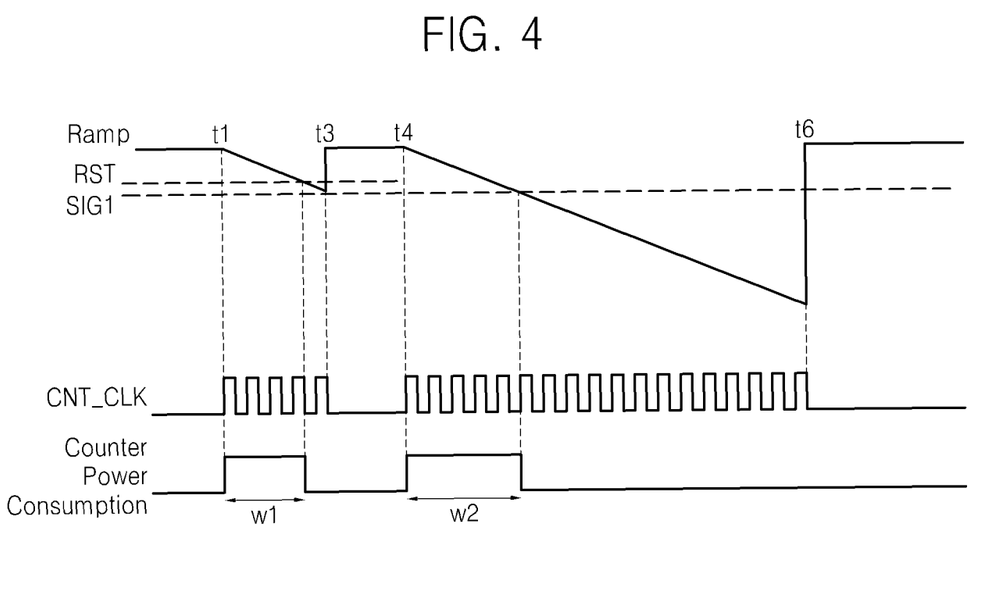
FIGS. 4 and 5 are additional waveform diagrams further illustrating certain data processing functions implicating the operation of the ADC according to embodiments of the inventive concept.
Figure 5:
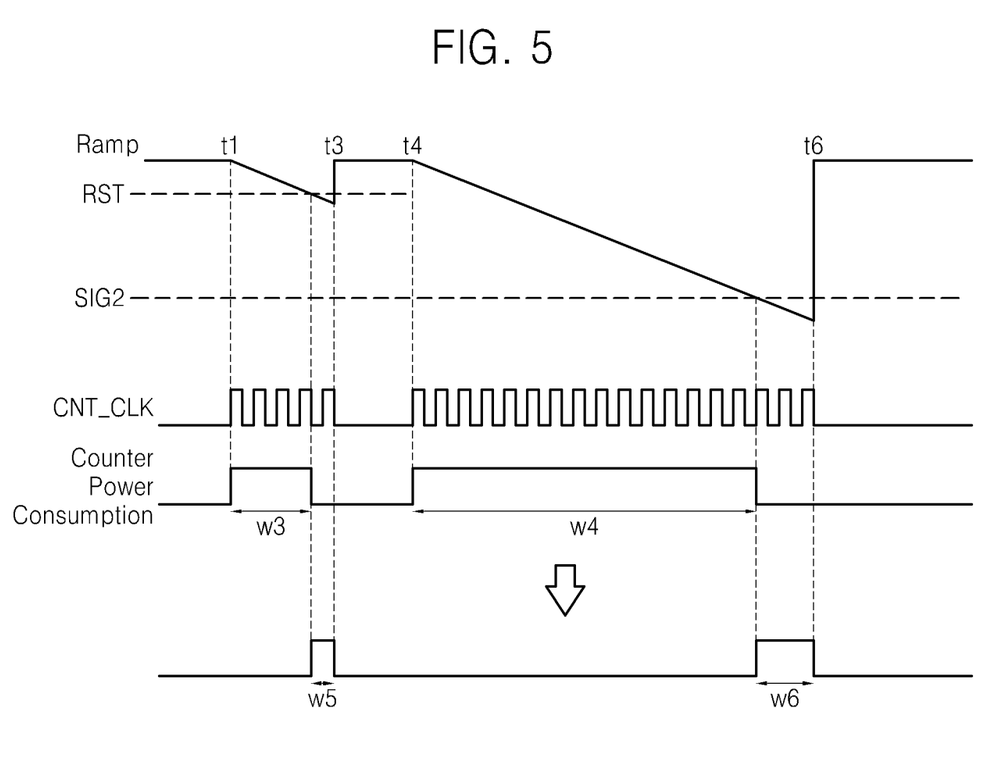

FIGS. 4 and 5 are diagrams further illustrating data processing that may be performed by the ADC 140 according to certain embodiments of the inventive concept. The data processing illustrated in FIGS. 4 and 5 will be described with reference to the previous description of the operation of the ADC 140 shown in FIG. 3.

Referring to FIGS. 4 and 5, the count clock signal (CNT_CLK) is provided to the ADC 140 from time t1 through time t3, and then from time t4 through time t6. Here, the power consumption of the counter block 150 changes in accordance with the luminance component of the light generating the image signal applied to the ADC 140.

When a reset signal (RST) and a first image signal (SIG1) shown in FIG. 4 are applied to the ADC 140, the counter block 150 performs counting during a first counting interval w1 and a second counting interval w2. As a result, the first and second counting intervals w1 and w2 are periods during which power is consumed by the counter block 150.

When the reset signal (RST) and a second image signal (SIG2) shown in FIG. 5 are applied to the ADC 140, power is consumed by the counter block 150 during third and fourth counting intervals w3 and w4. Unlike the second counting interval w2 shown in FIG. 4, the fourth counting interval w4 shown in FIG. 5 occupies more than half of a supply period (i.e., time t4 through time t6) of the count clock signal (CNT_CLK) corresponding to the second image signal (SIG2). Thus, in the alternative the counter block 150 may reduce power consumption by counting a fifth counting interval w5 and a sixth counting interval w6 which respectively correspond to supply periods for the count clock signal (CNT_CLK) corresponding to the reset signal less the third counting interval w3 and the supply period of the count clock signal (CNT_CLK) corresponding to the second image signal (SIG2) less the fourth counting period w4.

In other words, the counter block 150 changes counting periods depending on a determination about whether a count result provide by the counter block 150, i.e., a comparison result signal of the comparison block 180 is more than half of an output value of each column (e.g., more than 512 bits in a 10-bit counter), thereby reducing power consumption. In the specific circumstances where a Bayer pattern is apparent, a result of the determination performed with respect to an N-th row may be applied to an (N+2)-th row.

Figure 6:
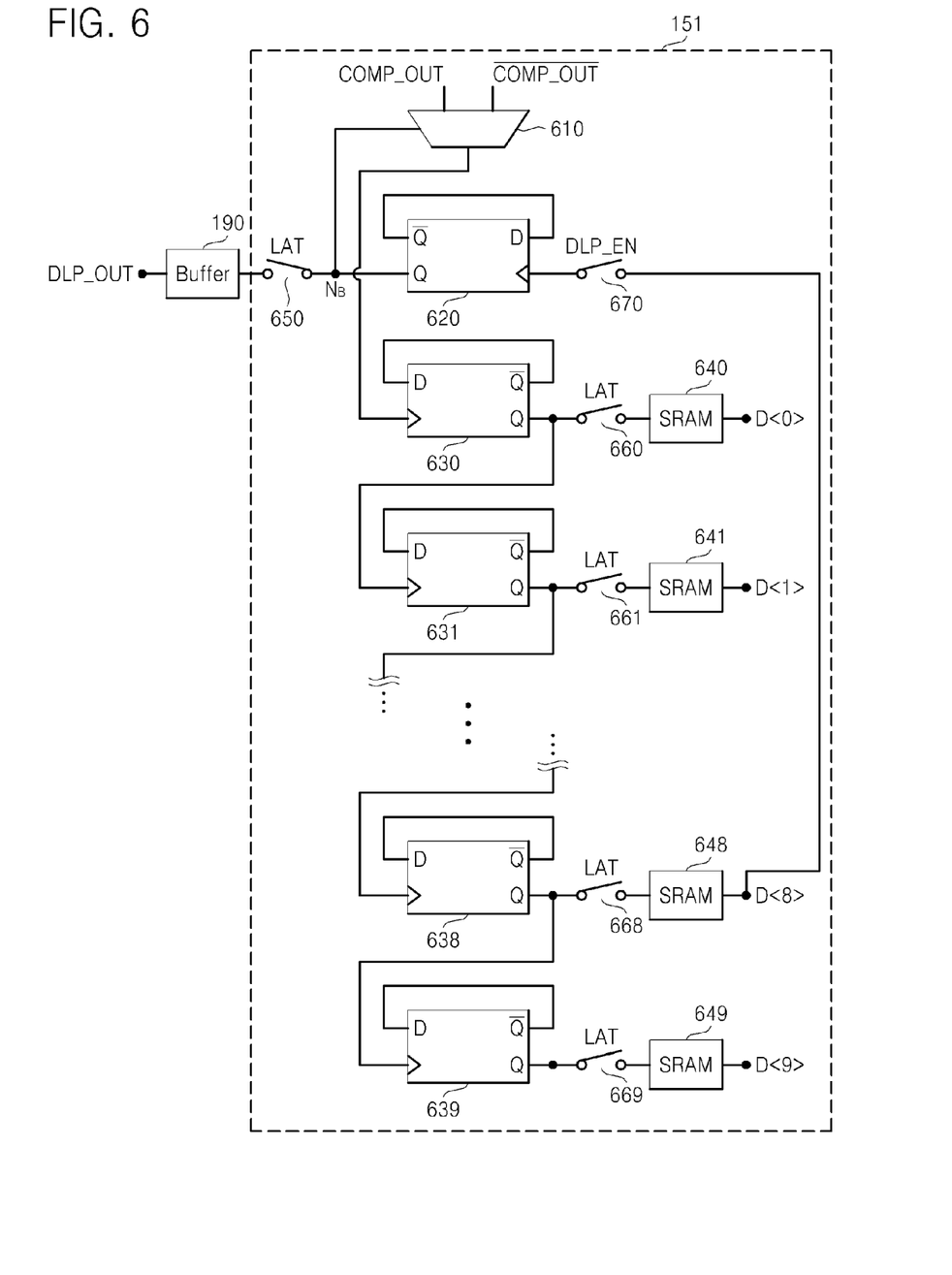
FIG. 6 is a digital block diagram illustrating one possible example of a counter that might be used to realize the data processing functions illustrated in FIGS. 4 and 5.
Figure 7:
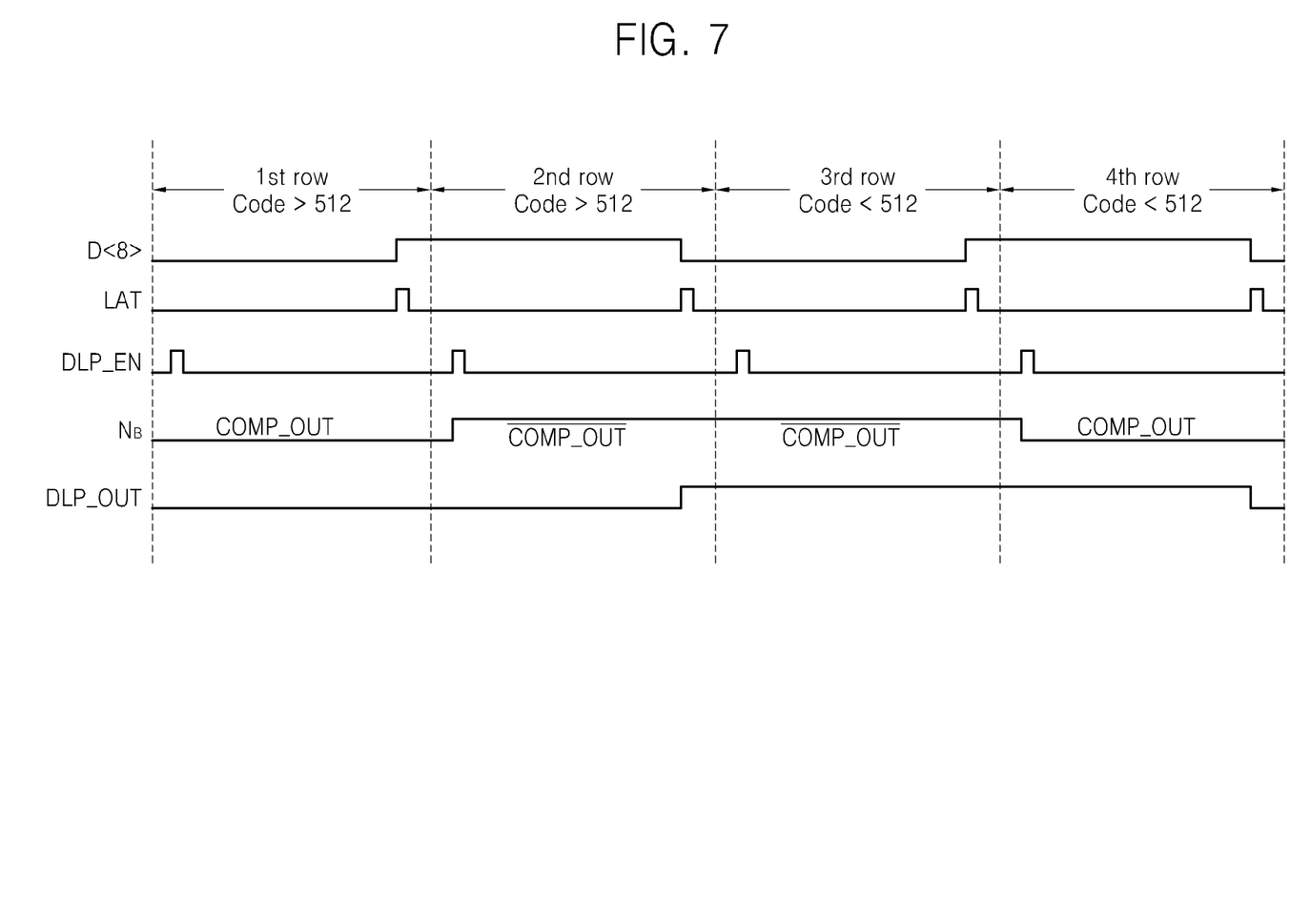
FIG. 7 is a timing chart further illustrating the operation of the counter shown in FIG. 6.

FIG. 6 is a block diagram further illustrating one possible counter 151 that may be used to realize the data processing described in FIGS. 4 and 5. FIG. 7 is a timing chart further illustrating operation of the counter 151 shown in FIG. 6.

Referring to FIGS. 6 and 7, the counter 151 comprises a multiplexer 610, first through tenth flip-flops 630 through 639, an eleventh flip-flop 620, and first through tenth SRAMs 640 through 649. The counter 151 illustrated in FIG. 6 is a 10-bit counter, but this is just an example and the present invention is not restricted thereto.

The multiplexer 610 receives the comparison result signal (COMP_OUT) and an inverted comparison result signal ($\overline{\text{COMP\_OUT}}$) from the comparison block 180 and outputs either the comparison result signal or the inverted comparison result signal to the first flip-flop 630 in response to an output signal of the eleventh flip-flop 620.

The first flip-flop 630 receives and stores the comparison result signal or the inverted comparison result signal and then transmits it to the second flip-flop 631.

The second through ninth flip-flops 631 through 638 perform the same operation as the first flip-flop 630.

The first through tenth SRAMs 640 through 649 are respectively connected to output terminals of the respective first through tenth flip-flops 630 through 639 via switches 660 through 669, respectively, which operate in response to a first control signal (LAT).

The first through tenth SRAMs 640 through 649 temporarily store signals D<0> through D<9>, respectively, of the output terminals of the respective first through tenth flip-flops 630 through 639. At this time, the ninth SRAM 648 is also connected to the eleventh flip-flop 620 and the signal D<8> temporarily stored in the ninth SRAM 648 may be input to the eleventh flip-flop 620.

The eleventh flip-flop 620 receives the signal D<8> from the ninth SRAM 648 via a switch 670 operating in response to a second control signal (DLP_EN). The signal D<8> corresponds to a half code indicating the half of an output value of a column in which the counter 151 is positioned. When the counter 151 is a 10-bit counter, the half code is 512, i.e., half of 1024.

An output terminal of the eleventh flip-flop 620 is connected to the buffer 190 via a switch 650 operating in response to the first control signal (LAT).

When the first control signal (LAT) is applied to the switches 660 through 669, the signals D<0> through D<9> are temporarily stored in the first through tenth SRAMs 640 through 649, respectively. FIG. 7 shows the waveform of the signal D<8> temporarily stored in the ninth SRAM 648. The waveform of the signal D<8> changes at a rising edge of the first control signal (LAT).

When the second control signal (DLP_EN) is applied to the switch 670, the signal D<8> is input to the eleventh flip-flop 620.

For instance, the switch 670 is switched at a rising edge of the second control signal (DLP_EN). When the switch 650 is switched in response to the first control signal LAT, the buffer 190 temporarily stores an output signal of the eleventh flip-flop 620 and then senses and amplifies it and then transmits it to the image signal processor 220.

With reference to FIGS. 1 and 6, the image signal processor 220 transmits a control signal to the camera control 210 so that the camera control 210 controls the control register block 175.

The control register block 175 determines whether the count result provided by the counter block 150 is greater than the input signal D<8> (e.g., half of an output value of a current column) and controls the counter block 150 to count different periods according to this determination result, thereby reducing power consumption.

Referring to FIG. 7, the count result with respect to a first row is greater than the input signal D<8> (e.g., 512 in the 10-bit counter), and therefore, the multiplexer 610 outputs the inverted comparison result signal at a second row when the second control signal (DLP_EN) is applied to the switch 670. Thereafter, when the first control signal (LAT) is applied, the switch 650 is switched and an output value (DLP_OUT) of the buffer 190 changes from low to high. The count result with respect to the second row is also greater than the input signal D<8> (e.g., 512 in the 10-bit counter), and therefore, the multiplexer 610 outputs the inverted comparison result signal at a third row when the second control signal (DLP_EN) is applied to the switch 670. The counter 151 counts during a counting interval when the comparison result signal is output by the multiplexer 610 and counts during another counting interval when the inverted comparison result signal is output by the multiplexer 610. Here, one counting interval corresponds to the first counting interval w1 and the second counting interval w2 shown in FIG. 4 and the other counting interval corresponds to the fifth counting interval w5 and the sixth counting interval w6 shown in FIG. 5.

The count result with respect to the third row is less than the input signal D<8> (e.g., 512 in the 10-bit counter), and therefore, the multiplexer 610 outputs the comparison result signal at a fourth row when the second control signal (DLP_EN) is applied to the switch 670. Thereafter, when the first control signal (LAT) is applied, the switch 650 switches and the output value (DLP_OUT) of the buffer 190 transits from the high level to the low level.

The first control signal (LAT) and the second control signal (DLP_EN) may be applied to the ADC 140 by the timing generator 170. The first through fourth rows may be consecutive rows, but the subject inventive concept is not restricted thereto. For instance, they may be positioned in every other row.

Figure 8:
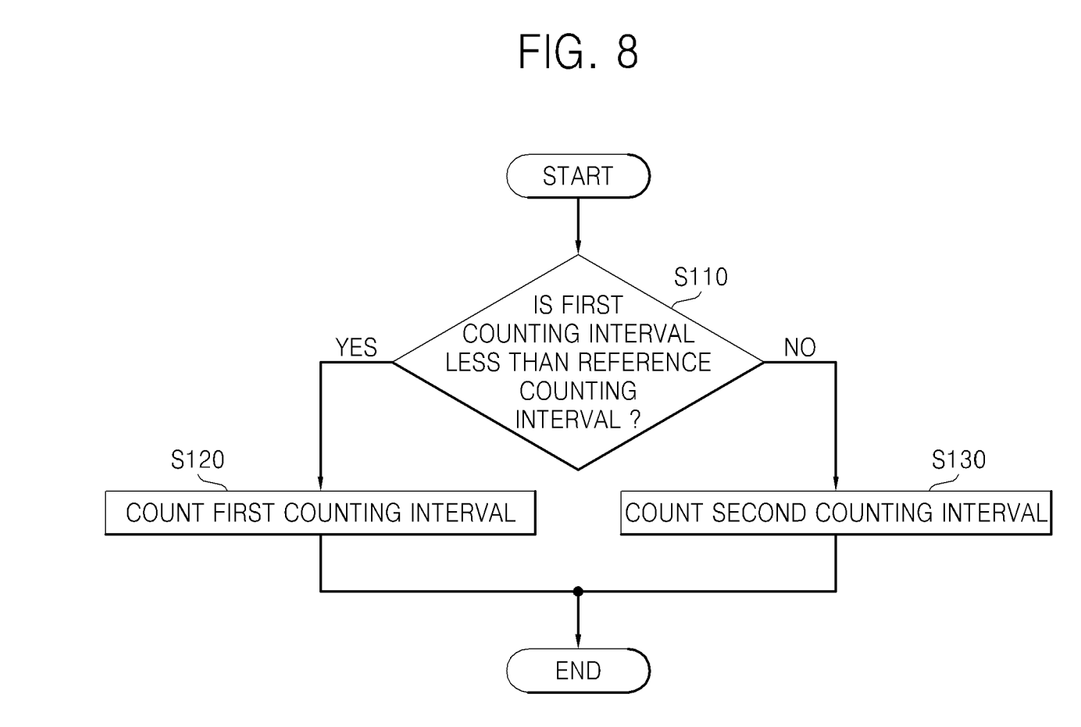
FIG. 8 is a flowchart summarizing one possible method of data processing according to certain embodiments of the inventive concept.

FIG. 8 is a flowchart summarizing a data processing method according to certain embodiments of the inventive concept. The data processing method may be performed on each column using the counter block 150 or the counter 151. Referring to FIG. 8, whether a first counting interval is less than a reference counting interval is determined in operation S110. Here, the first counting interval may be an interval extending from a point when a ramp signal starts decreasing to a point when the ramp signal is equal to an image signal and the reference period may be half of a supply period for the count clock signal (CNT_CLK). To determine whether the first counting interval is less than the reference counting interval, whether the count result satisfies the relationship [(ΔV+Vsig)+(−ΔV)=Vsig)] described in FIG. 3 is less than a half code (e.g., 512 in a 10-bit counter) is determined.

When it is determined that the first counting interval is less than the reference counting interval, clocks are counted during the first counting interval in operation S120. When it is determined that the first counting interval is not less than the reference counting interval, clocks are counted during a second counting interval in operation S130. Here, the second counting interval may be a period corresponding to a difference between the supply period of the count clock signal CNT_CLK and the first count period. Therefore, the counter block 150 counts different periods according to the determination result, thereby reducing power consumption.

Figure 9:
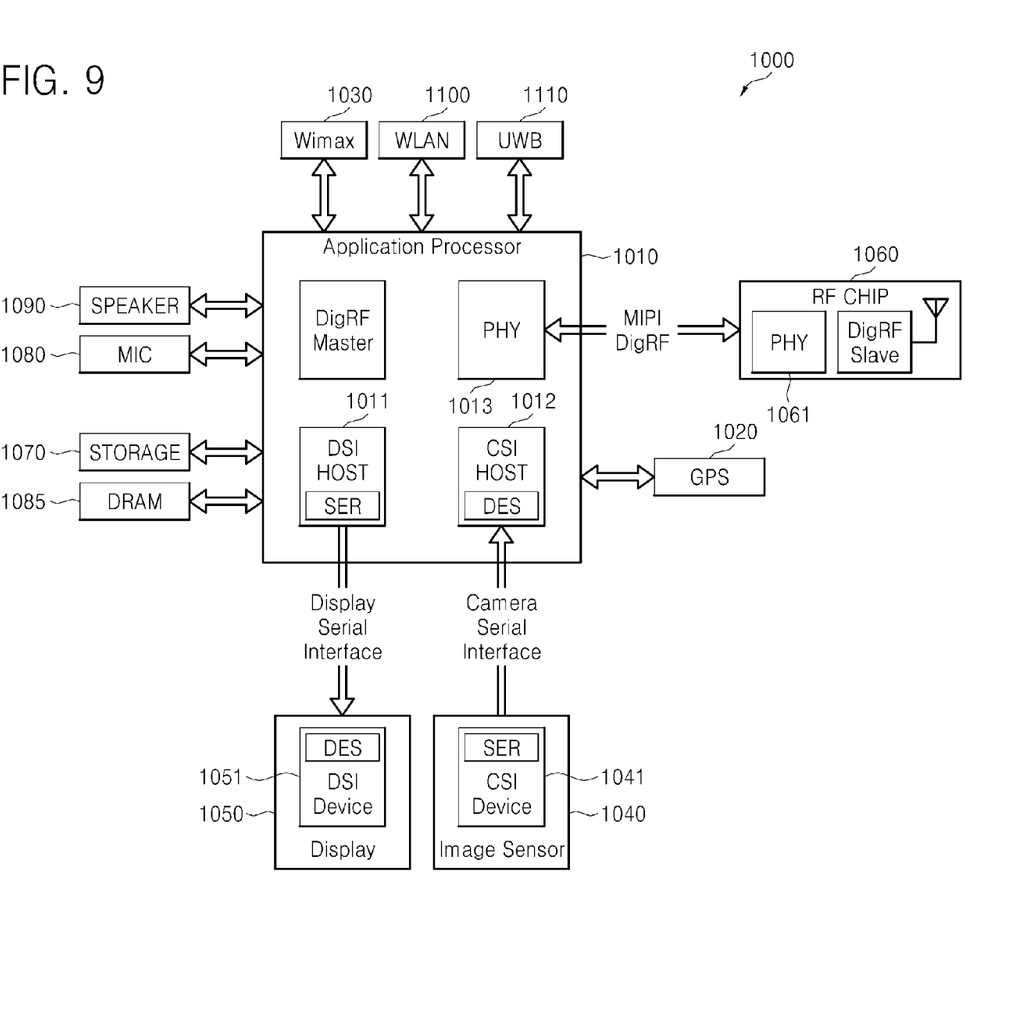
FIG. 9 is a schematic block diagram of an electronic system 1000 incorporating an image sensor according to an embodiment of the inventive concept.

FIG. 9 is a schematic block diagram of an electronic system 1000 capable of incorporating an image sensor according to an embodiment of the inventive concept. The electronic system 1000 may be implemented as a data processing device, such as a mobile phone, a personal digital assistant (PDA), a portable media player (PMP), or a smart phone, which can use or support mobile industry processor interface (MIPI).

The electronic system 1000 includes an application processor 1010, an image sensor 1040, and a display 1050.

A camera serial interface (CSI) host 1012 implemented in the application processor 1010 may perform serial communication with a CSI device 1041 included in the image sensor 1040 through CSI. At this time, an optical deserializer may be implemented in the CSI host 1012 and an optical serializer may be implemented in the CSI device 1041.

A display serial interface (DSI) host 1011 implemented in the application processor 1010 may perform serial communication with a DSI device 1051 included in the display 1050 through DSI. At this time, an optical serializer may be implemented in the DSI host 1011 and an optical deserializer may be implemented in the DSI device 1051.

The electronic system 1000 may also include a radio frequency (RF) chip 1060 communicating with the application processor 1010. A physical layer (PHY) 1013 of the application processor 1010 and a PHY 1061 of the RF chip 1060 may communicate data with each other according to MIPI DigRF.

The electronic system 1000 may further include a global positioning system (GPS) 1020, a storage 1070, a microphone (MIC) 1080, a dynamic random access memory (DRAM) 1085, and a speaker 1090. The electronic system 1000 may communicate using a Worldwide interoperability for microwave access (Wimax) 1030, a wireless local area network (WLAN) 1100, and an ultra-wideband (UWB) 1110.

The present inventive concept may be embodied, wholly or in part, as computer-readable code on a computer-readable medium. The computer-readable recording medium may be any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices. Functional programs, codes, and code segments to accomplish the present general inventive concept can be easily construed by programmers skilled in the art to which the inventive concept pertains.

According to some embodiments of the present invention, an ADC and an image sensor including the same are capable of decrease the operating duration of a counter block in the ADC, thereby reducing power consumption.

While the present inventive concept has been particularly shown and described with reference to exemplary embodiments thereof, it will be understood by those of ordinary skill in the art that various changes in forms and details may be made therein without departing from the scope of the following claims.

What is claimed is:

1. An analog-to-digital converter (ADC) configured for use within an image sensor including an array of pixels arranged in a plurality of columns, the ADC comprising:
   a comparator configured to compare a decreasing ramp signal with an image signal provided by a column of pixels and output a comparison result signal; and
   a counter configured to receive the comparison result signal and generate a count result by counting a clock during a counting interval,
   wherein the ADC determines whether a first counting interval for the counter is less than a reference interval, and if the first counting interval is less than the reference interval the counting interval is the first counting interval, else the counting interval is a second counting interval;
   wherein the first counting interval is a period extending from a first time when the ramp signal begins decreasing to a second time when the ramp signal is equal to the image signal, and
   wherein the reference interval is equal to a period that is half of a supply period for a count clock signal applied to the counter.

2. The ADC of claim 1, wherein the second counting interval is a period equal to a difference between the supply period of the count clock signal and the first counting interval.

3. The ADC of claim 1, wherein the counter comprises:
   a multiplexer configured to receive the comparison result signal and an inverted comparison result signal;
   first through N-th flip-flops connected in series to the multiplexer; and
   an M-th flip-flop configured to receive an output signal of the (N−1)-th flip-flop and output the output signal of the (N−1)-th flip-flop to the multiplexer,
   wherein the first flip-flop receives and stores an output signal of the multiplexer and each of the first through (N−1)-th flip-flops transmits an output signal to a subsequent flip-flop.

4. The ADC of claim 2, wherein the counter counts whether the comparison result signal is less than half a code length for the counter to determine whether the first counting interval is less than the reference interval.

5. The ADC of claim 3, wherein the counter further comprises:
   first through N-th static random access memories (SRAMs) respectively connected to output terminals of the respective first through N-th flip-flops via first through N-th switches, respectively, each switch being responsive to a first control signal to temporarily store output signals of the respective first through N-th flip-flops; and
   the M-th flip-flop is connected with the (N−1)-th SRAM via an M-th switch which switches in response to a second control signal.

6. An image sensor comprising:
   a pixel array comprising a plurality of pixels arranged in columns, wherein each column of pixels is configured to provide an image signal;
   a correlated double sampling (CDS) block configured to perform correlated double sampling on the image signal and provide a corresponding CDS output signal;
   a ramp generator configured to generate a decreasing ramp signal; and
   an analog-to-digital converter (ADC) configured to receive the CDS output signal and the ramp signal, and comprising:
      a comparator configured to compare the ramp signal with the image signal and output a comparison result signal; and
      a counter configured to receive the comparison result signal and generate a count result by counting a clock during a counting interval,
      wherein the ADC determines whether a first counting interval for the counter is less than a reference interval, and if the first counting interval is less than the reference interval the counting interval is the first counting interval, else the counting interval is a second counting interval;
      wherein the first counting interval is a period extending from a first time when the ramp signal begins to decrease and a second time when the ramp signal is equal to the image signal; and
      wherein the reference interval is equal to half of a supply period for a count clock signal applied to the counter.

7. The image sensor of claim 6, wherein the second counting interval is a period corresponding to a difference between the supply period for the count clock signal and the first counting interval.

8. The image sensor of claim 6, wherein image signal comprises a reset signal component and an image signal component.

9. An electronic system comprising the image sensor of claim 6.

10. The image sensor of claim 7, wherein the counter counts whether the comparison result signal is less than half a code length for the counter to determine whether the first counting interval is less than the reference interval.

* * * * *